(12) United States Patent
Annema et al.

(10) Patent No.: US 6,320,414 B1
(45) Date of Patent: Nov. 20, 2001

(54) HIGH-VOLTAGE LEVEL TOLERANT TRANSISTOR CIRCUIT

(75) Inventors: Anne Johan Annema; Godefridus Johannes Gertrudis Maria Geelen, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/571,671

(22) Filed: May 15, 2000

(30) Foreign Application Priority Data

May 14, 1999 (EP) .................................................. 99201518

(51) Int. Cl.⁷ ............................................. H03K 19/0185
(52) U.S. Cl. ................................. 326/80; 326/83; 326/87
(58) Field of Search .................................. 326/80, 81, 83, 326/86, 87

(56) References Cited

U.S. PATENT DOCUMENTS 5,440,249 * 8/1995 Schucker et al. ...................... 326/81
5,493,244 2/1996 Pathak et al. ......................... 327/313
5,818,280 * 10/1998 Martin ..................................... 326/80
5,825,206 10/1998 Krishnamurthy et al. ............. 326/81
5,952,875 * 9/1999 Yosefin et al. .......................... 326/81
6,064,227 * 5/2000 Saito ...................................... 326/80

FOREIGN PATENT DOCUMENTS

0902517A2   3/1999   (EP) ................................. H02H/9/04
0902517A3   3/1999   (EP) ................................. H02H/9/04
2316751A    3/1998   (GB) ............................... G01R/31/317

* cited by examiner

*Primary Examiner*—Michael Tokar
*Assistant Examiner*—Don Phu Le
(74) *Attorney, Agent, or Firm*—Steven R. Biren (57) ABSTRACT

A high-voltage level tolerant transistor circuit, comprising a plurality of cascoded transistors, including a first transistor (T1) operatively connected to a high-voltage level node (3) and a second transistor (T2) operatively connected to a low-voltage level node (2). The first transistor (T1) connects to a biasing circuit (8), such as a voltage level shifter, providing a variable biasing level (V1) relative to a voltage level ($V_H$) at the high-voltage level node (3).

15 Claims, 9 Drawing Sheets

HIGH-VOLTAGE LEVEL TOLERANT TRANSISTOR CIRCUIT

The invention relates to a high-voltage level tolerant transistor circuit, comprising a plurality of cascoded transistors, including a first transistor operatively connecting to a high-voltage level node and a second transistor operatively connecting to a low-voltage level node, wherein said first transistor connects to a biasing circuit providing a variable biasing level.

In field effect transistors, for example, high electrical fields across the gate oxide leads to oxide degradation and eventually breakdown. Hot channel electron injection, due to over-voltages, also yields gate oxide degradation. In present field effect transistors, electrical oxide fields up to 5.5 MV/cm are acceptable. Junction breakdown poses in general no serious problem for voltages at twice the nominal supply voltage of a transistor. The main cause of transistor degradation is, however, formed by hot-electron injection providing an accumulated degradation at voltages above the nominal supply voltage.

High-voltage level tolerant transistor circuits are, for example, used as Input/Output (I/O)-buffer circuits between electronic circuitry such as I/O cells, operating at different supply voltages. In ordinary I/O cells, the output voltage swing is equal or lower than the nominal supply voltage allowed for the semiconductor process in which the circuit is realised. To increase the tolerable voltage swing at the I/O pad without running into lifetime problems of the transistors from too high electrical fields across the transistor terminals, the operating voltages across the terminals of the transistors of the cell have to be limited. This is typically done by using properly biased cascoded transistors, such as disclosed in U.S. Pat. No. 5,825,206.

According to this prior art solution, complex data signal controlled biasing circuitry is used for biasing the cascoded transistors in order to avoid lifetime problems.

It is an object of the invention to provide a simple high-voltage tolerant transistor circuit robust to at least twice the nominal internal supply voltage of the circuit.

To this end, according to the invention, the biasing circuit is arranged for providing a biasing level relative to the voltage level at the high-voltage level node.

The invention is based on the recognition that life-time problems of, for example, the cascoded transistor connecting to the high-voltage level node can be reduced by controlling the biasing level of this transistor in response to the voltage at the high-voltage level node.

Following the invention, the biasing voltage level is decreased if the voltage level at the high-voltage level node is below a first threshold and the biasing voltage level is increased if the voltage level at the high-voltage level node is above a second threshold. The first and second thresholds and the actual biasing voltage levels have to be chosen such that differences between the voltage level at the high-voltage level node and the biasing voltage level do not exceed values of approximately the nominal supply voltage of the transistor circuit.

In an embodiment of the biasing circuit according to the invention, a voltage level shifter operative in response to the voltage level at the high-voltage level node is used to obtain the desired biasing level of the first cascoded transistor.

In a relatively simple embodiment of the high-voltage level tolerant transistor circuit according to the invention, a third transistor is cascoded between the first and second transistor, wherein the first and third transistor having their control electrode connected for biasing by an internal supply voltage of the transistor circuit, and wherein the voltage level shifter comprises at least one fourth transistor operatively connected as a diode for bypassing the first transistor.

The number of diode connected transistors is determined by the maximum tolerable voltage at the high-voltage level node and the maximum junction voltage of the first transistor, such as the drain-gate voltage in case of a field effect transistor.

In order to avoid limitation of the voltage level at the high-voltage level node by the drain-gate voltage of the first transistor, in a further embodiment of the invention, an active control for the biasing voltage at the control electrode of the first transistor is provided in that the biasing circuit comprises a bistable trigger circuit having a biasing terminal for applying a biasing voltage, wherein the trigger circuit is arranged for providing a variable biasing level for biasing the first transistor in response to the voltage level at the high-voltage level node.

In case of a field effect transistor, the bistable trigger circuit according to the invention provides an active control of the drain-gate voltage of the first transistor, dependent on the above-mentioned first and second thresholds.

In an embodiment of the biasing circuit according to the invention, the trigger circuit comprises a fifth and sixth transistor of opposite conductivity type compared to the first transistor, the fifth and sixth transistor having a first channel electrode operatively connected to a control electrode of the first transistor, the fifth transistor having a second channel electrode comprising the biasing terminal, the sixth transistor having a second channel electrode connected to a first channel electrode of the first transistor downstream of said high-voltage level node, and the fifth and sixth transistor having their control electrode operatively connected to the second channel electrode of the sixth and fifth transistor, respectively.

In the case of field effect transistors, the bistable trigger circuit operates such that the gate-source voltage of the first cascode transistor is low for a high-voltage at the high-voltage level node, and the gate-source voltage of the first transistor is high if the voltage at the high-voltage level node is low.

In a preferred embodiment of the transistor circuit according to the invention, the trigger circuit comprises a fifth and sixth transistor of opposite conductivity type compared to the first transistor, the fifth and sixth transistor having a first channel electrode operatively connected to a control electrode of the first transistor, the fifth transistor having a second channel electrode comprising the biasing terminal, the sixth transistor having a second channel electrode connected to a second channel electrode of the first transistor upstream towards the high-voltage level node, and the fifth and sixth transistor having their control electrode operatively connected to the second channel electrode of the sixth and fifth transistor, respectively.

With this preferred embodiment, in the case of field effect transistors, the drain-gate voltage of the first cascode transistor is controlled providing less leakage current.

Advantageously, because of reducing the channel hot-electron injection without increasing the oxide fields, the above bistable trigger biasing circuits are stackable for plural cascoded first transistors, wherein the biasing terminal of a stack is operatively connected to the control electrode of a first transistor of an adjacent stack downstream of the high-voltage level node. In practice, in the case of field effect transistors, with each added cascoded transistor and associated biasing circuit, the tolerable voltage at the high-voltage level node is roughly increased by 1 V.

For applications in which the tolerable voltage provided by a single first transistor and bistable biasing circuit is just (a fraction) too low, an extra cascode stage can be prevented by the expense of the addition of a relatively small level shifter, such as a diode connected transistor, operatively series connected with the second electrode of the sixth transistor.

In the case of stacked first transistors and associated biasing circuits, if the tolerable voltage level is just too low, addition of a further stack can be prevented at the expensive of a yet further voltage level shifter operatively series connected with the biasing supply voltage.

In an embodiment of the transistor circuit according to the invention, this yet further level shifter comprises a seventh transistor of opposite conductivity type compared to the third transistor, the seventh transistor comprising a control electrode operatively connected to a channel electrode of the third transistor upstream towards the high-voltage level node, a second level electrode operatively connected to a control electrode of the third transistor, and a first channel electrode operatively connected for biasing a biasing circuit upstream towards to the high-voltage level node.

In an alternative embodiment of the transistor circuit according to the invention, the level shifter comprises a fourth transistor operatively connected as a diode in series between the high-voltage level node and the first transistor, and further comprising a cascoded eight and ninth transistor, the eight transistor being operatively connected to the high-voltage level node, and a tenth transistor operatively series connected between the voltage level shifter and a first inverting input of a differential circuit, a non-inverting second input of which operatively connects to the low-voltage level node and an output of which connects to a control electrode of the ninth transistor, wherein the first, tenth and eight transistors having their control electrode connected for biasing by a supply voltage of the transistor circuit.

In this embodiment, the transistor circuit consists of two stacks of cascoded transistors, each operating in a specific region. The stack including the first transistor and level shifter operates at high-voltage levels at the high-voltage level node, in a manner as disclosed above, while the stack comprising the eight and ninth transistor is enabled for low voltages at the high-voltage level node. To this end, the tenth transistor in connection with the inverter circuit operates as sensing means for sensing the voltage level at the high-voltage level node.

In order to ensure correct functioning of the transistor circuit in applications while the internal supply voltage is down, which may occur in systems wherein chips communicate on a large bus having a power-down mode, for example, according to the invention, the transistor circuit further comprises a cascode voltage generator circuit for applying a biasing voltage, which cascode voltage generator circuit comprises a first voltage level shifter operatively connected to the high-voltage level node for providing a biasing voltage, and a power-up-switch circuit arranged for switching between the biasing voltage supplied by a power-down-start up circuit and an internal supply voltage of the transistor circuit.

In a relatively simple embodiment of the transistor circuit according to the invention, the power-down start-up circuit comprises a first and second series connected diode stack, such as diode connected transistors, and the power-up switch circuit comprises a first and second transistor switch, series connected between the diode stacks.

The power-down start-up circuit charges the cascoded transistors in power-down mode whenever necessary. In power-up mode it is convenient to bias the cascode at the internal supply voltage, which is achieved by the power-up switch circuit.

Instead of stacking further cascoded transistors in order to enhance the tolerable voltage level, in a further embodiment of the invention, cascoded transistors of different conductivity type and associated biasing circuits are arranged for connection between the high-voltage level node and a first supply voltage node, such as system ground, and between the high-voltage level node and the second supply voltage level node which, in use, has a voltage level in access of the voltage level at the high-voltage level node. With this circuit, tolerable voltages up to three times the internal supply voltage of the transistor circuit can be handled.

The invention will now be described in more detail with reference to the accompanying drawings, in which.

In the figures, parts of elements having like-functions or purpose bear the same reference symbols.

In the field of Metal Oxide Semiconductor Transistor (MOST) circuits, for example, the supply voltage decreases with each new design generation, due to the ever decreasing gate oxide thickness.

However, in order to interconnect semiconductor circuits of several generations, high/voltage tolerant Input/Output (I/O)-buffer circuits are used, both I/O-output cells and I/O-input cells.

Figure 1:
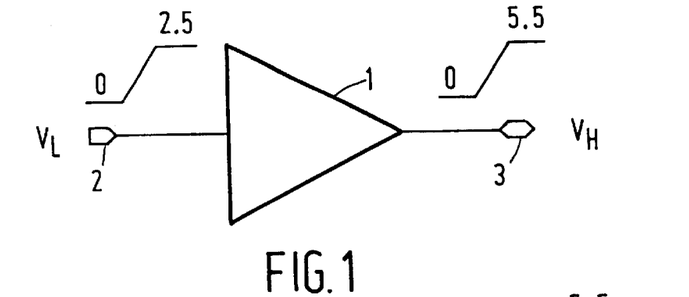
FIG. 1 is a schematic representation of an I/O-output cell.

FIG. 1 shows an I/O-output cell 1, having a low-voltage level node or pad 2 and a high-voltage level node or pad 3. In the case of a digital I/O-output cell, for example, the voltage $V_L$ at the low-voltage level node 2 may range from 0 to 2.5 V and the voltage $V_H$ at the high-voltage level node 3 may range from 0 V to 5.5 V, corresponding to a binary "0" and "1", respectively.

Figure 2:
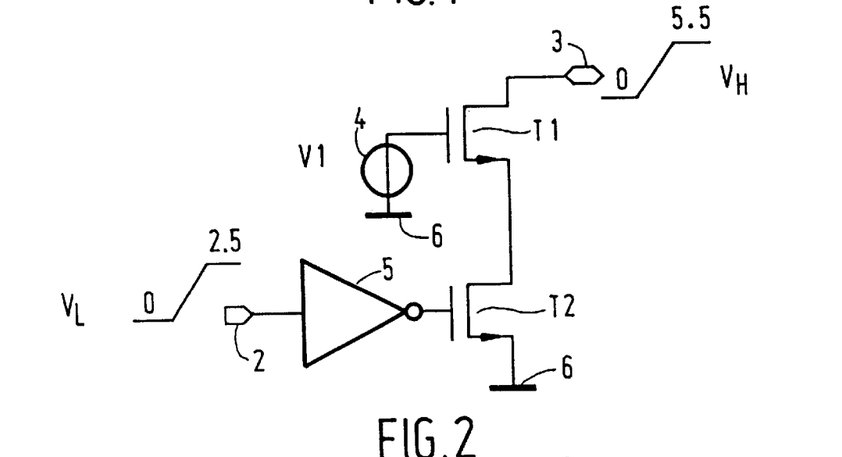
FIG. 2 is a schematic representation of a typical implementation of the circuit of FIG. 1.

In MOSTs, for example, the conventional way to achieve high-voltage tolerance is using a biased cascoded transistor circuit, such as shown in FIG. 2. For illustration purposes, only field effect transistors are used. The invention is, however, not limited to digital I/O-cells and MOST, but can also be applied to analog circuits, bipolar transistors and the like.

In the circuit of FIG. 2, for simplicity reasons, an open drain cell is shown, having first and second NMOS cascoded transistors T1 respectively T2. That is, the drain of transistor T1 connects directly to the high-voltage level node 3. In the circuit of FIG. 2, the transistor T2 is driven via an inverter 5, whereas the first transistor T1 is biased by a biasing voltage source 4. System ground is indicated by a short bold line 6. The inverter 5 may be replaced by any other suitable driving circuit such as but not limited to a NAND gate, a buffer circuit etc.

To achieve high-voltage tolerance up to twice the maximum internal supply voltage Vdd, for example, drain-source, gate-source and gate-drain voltages above the nominal supply voltage Vdd of the semiconductor process in which the transistors are designed have to be prevented, to avoid life-time problems due to channel hot-electron injection or direct oxide degradation.

That is, in the circuit of FIG. 2, to achieve 2*Vdd tolerance in circuits running at 2.5 V supply voltage, for example, the on-state drain-source voltage of T1 and T2 may not exceed 2.5 V. With an internal supply voltage Vdd of 2.5 V, this implies that the biasing voltage V1 of the biasing voltage source 4 has to satisfy:

V1<Vdd+Vgs wherein:
Vdd is the internal supply voltage, and
Vgs is the gate-source voltage of transistor T1 directly after switching "on".

This conventional circuit has a number of drawbacks. The biasing voltage V1 is higher than the internal supply voltage Vdd and thus difficult to realize, whereas the biasing voltage has to be set very accurately. If one of these requirements are not satisfied, life-time of the circuit can not be ensured. Only in the ideal case 2*Vdd tolerance can be obtained. However, the safety margin in this case is zero, which prevents practical use.

Figure 3:
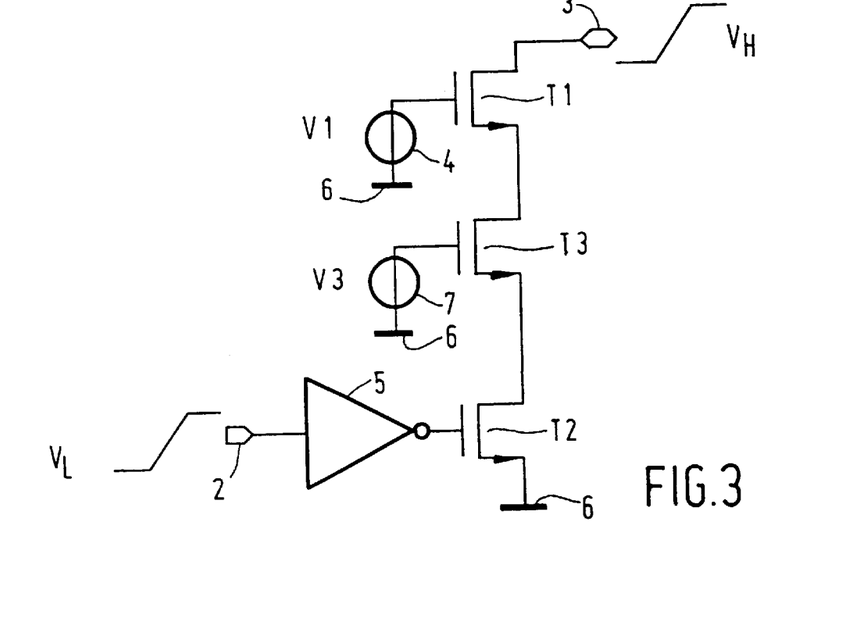
FIG. 3 is another implementation of the circuit of FIG. 1.

Adding a third cascoded NMOS transistor T3, leads to the circuit as shown in FIG. 3. This cascoded transistor T3 is biased by a voltage source 7 providing a biasing voltage V3.

Assuming an internal voltage level Vdd of 2.5 V, in order to achieve 2*Vdd voltage tolerance, the third transistor T3 may be biased with a voltage V3 equal to the internal voltage level Vdd of 2.5 V. The first transistor T1 has to be biased with a voltage near twice the internal supply voltage, i.e. V1≈5 V. With a voltage of 2.5 V at the low-voltage level node 2, transistor T2 exhibits only off-state leakage, such that the source electrode of transistor T3 is at a voltage near the internal supply voltage Vdd of 2.5 V. With a biasing voltage V3 of 2.5 V, transistor T3 exposes off-state leakage and, accordingly, the cascoded transistor T1. The gate electrode of transistor T1 is at a voltage equal to the biasing voltage V1 of transistor T1, that is about 5 V in the present example. Accordingly, the voltage level at the high-voltage level node 3 will be about 5.5 V. In this so-called steady state "high", it can be seen that the voltage across the terminals of the cascoded transistors, in particular the drain-gate, do not exceed the internal supply voltage Vdd. The circuit has an appropriate safety margin by a proper selection of the biasing voltages of the cascoded transistors.

With a low-level voltage of 0 V at the low-voltage level node 2, transistor T2 will be fully switched on, i.e. fully conductive, such that the source of transistor T3 is at a voltage near system ground, that is 0 V. With a biasing voltage V3 of about Vdd, transistor T3 is also fully conductive, such that the source electrode of transistor T1 will be at ground level voltage. Accordingly, the high-voltage level node 3 will be at a voltage level of 0 V.

However, with a fixed biasing voltage V1 of about 5 V, in this steady "low" state, the voltage across the drain-gate terminals of transistor T1 is at about twice the maximum voltage Vdd of the semiconductor process, which leads to life-time problems due to high oxide fields, as mentioned above. The voltage drop across the gate-source terminals of transistor T1 is likewise at twice the internal supply voltage Vdd which will give rise to relatively high oxide-fields. Junction breakdown due to an over voltage between the drain and the bulk of the semiconductor circuit will, in most practical cases, provide no particular problem for voltages at twice the maximum supply voltage Vdd.

Figure 4:
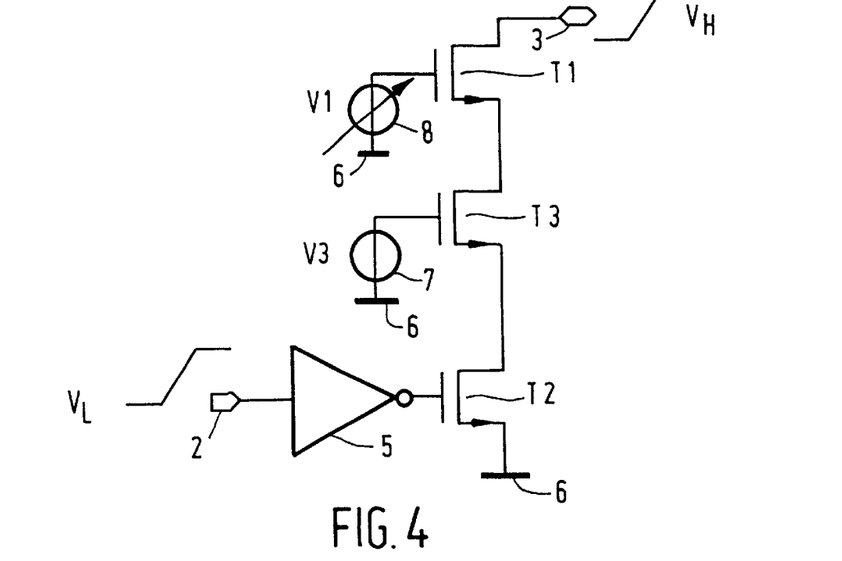
FIG. 4 is a simplified circuit diagram, illustrating the basic principle of the present invention.

In order to avoid life-time problems for transistor T1 in the circuit of FIG. 3, in accordance with the invention, transistor T1 is biased by a variable biasing source 8 having a variable biasing voltage V1, as schematically shown in FIG. 4. The biasing voltage V1 is varied such that:

$$V1 \approx \begin{cases} V1H \text{ if } V_H > Vth1 \\ V1L \text{ if } V_H < Vth2 \end{cases} \quad (1)$$

wherein:
V1H=high biasing voltage level,
V1L=low biasing voltage level,
Vth1=first threshold voltage,
Vth2=second threshold voltage.

The high biasing voltage level V1H has to be chosen sufficiently high to ensure life-time of T1 if the voltage at the high-voltage level node 3 is high, typically V1H>Vdd. The low biasing voltage level V1L has to be low enough to ensure life-time if $V_H$ is low and has to be sufficiently high such that the cascoded transistors T1, T2 are not switched off. That is, the cascoded transistor circuit has to remain in a weakly conductive state. Typically, V1L can be equal to, for example, Vdd. The threshold voltages Vth1 and Vth2 can be chosen appropriately, among others dependent on the semiconductor process in which the transistor circuit is formed.

In accordance with the invention, the biasing voltage source 8 is arranged for providing a biasing voltage V1 relative to the voltage level at the high-voltage level node 3, such that the biasing voltage V1 "follows" the voltage at the high-voltage level node 3.

Figure 5:
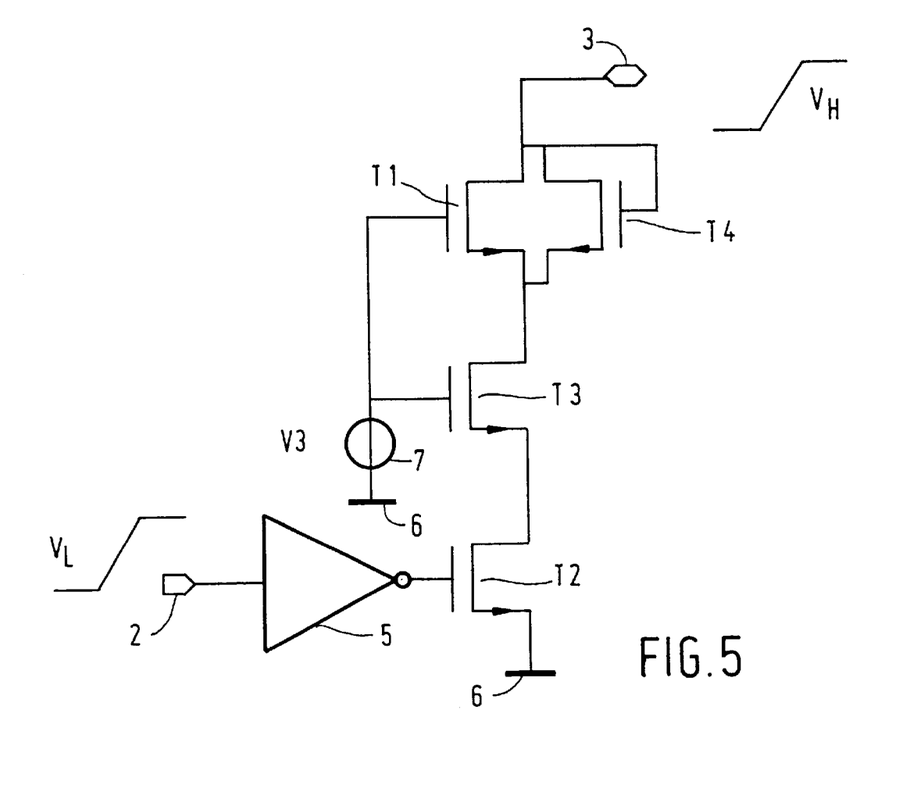
FIG. 5 shows a first embodiment of a high-voltage level tolerant transistor circuit in accordance with the present invention.

In a first embodiment of the invention, the circuit diagram of which is shown in FIG. 5, a biasing circuit in the form of a diode-connected NMOS transistor T4 is operative for bypassing the main channel of transistor T1.

With reference to (1) above, the diode-connected transistor T4, having its gate and drain electrode connected to the drain electrode of transistor T1 and its source electrode connected to the source electrode of transistor T1, acts as a voltage level shifter such that:

$$V1 \approx \begin{cases} V_H - \Delta V & \text{if } V_H > Vth1 \\ VIL & \text{if } V_H < Vth2 \end{cases} \quad (2)$$

wherein:

ΔV=voltage level shift provided by transistor T4.

The transistor circuit operates as follows.

Both transistors T1 and T3 are biased by the fixed voltage source 7, providing a biasing voltage V3, for example equal to the internal supply voltage Vdd of the circuit. Assuming that $V_L$ at the low-voltage level node 2 is "high", transistor T2 will be in its off-state, exhibiting off-state leakage. Accordingly, at the source of transistor T3 a voltage more or less equal to the biasing voltage V3 applies. With a voltage at the high-voltage level node 3 of about 2 Vdd, the diode-connected transistor T4—which is in forward direction downstream of the high-voltage level node 3—will be in a conductive state, such that the voltage at the drain of transistor T3 equals $V_H - \Delta V$, wherein ΔV is the voltage drop across the diode-connected transistor T4 in forward direction. From FIG. 5, it can be derived that the gate-source biasing voltage of transistor T1, Vgs1, equals:

$$Vgs1 = V_3 - (V_H - \Delta V) \quad (3)$$

In the case of a 2*Vdd tolerant transistor circuit, that is $V_H$=2 Vdd and V3=Vdd, from (3) it follows that:

$$Vgs1 = -(Vdd - \Delta V) \quad (4)$$

Accordingly, with a high-voltage at the high-voltage level node 3 and with V3=Vdd, neither the drain-gate voltage of transistor T1 nor the gate-source voltage of transistor T1 exceeds the maximum internal supply voltage Vdd of the circuit.

If a "low" voltage $V_L$ is applied at the low-voltage level node, the transistors T1, T2 and T3 are in a conductive state, such that the voltage at the high-voltage level node 3 is at a low level, approximately system ground. Such as explained above with reference to FIG. 3. Accordingly, transistor T4 is non-conductive. Contrary to the circuit of FIG. 3, with V3=Vdd the voltage across the drain-gate junction of transistor T1 does not exceed Vdd, neither does the gate-source voltage of transistor T1.

Accordingly, with the transistor circuit according to the invention in the embodiment shown in FIG. 5, life-time problems are effectively avoided.

If the transistor circuit has to be tolerant to voltages at the high-voltage level node 3 in excess of 2*Vdd, a higher voltage level shift has to be provided, which can be easily realized by a stack of diodes or diode-connected transistors replacing the single diode-connected transistor T4. In such case, however, it will be clear that the voltage level at the high-voltage level node 3 gets limited by the oxide-field requirements of transistor T1, that is the drain-gate voltage of T1 determines the maximum tolerable output voltage $V_H$.

Figure 6:
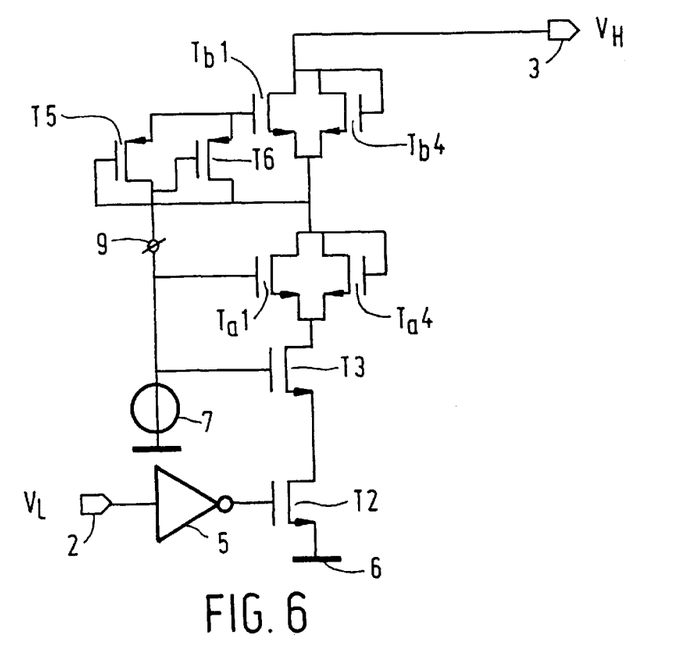
FIG. 6 shows a second embodiment of a high-voltage level tolerant transistor circuit in accordance with the present invention.

FIG. 6 shows a second embodiment of the transistor circuit according to the present invention, wherein the drain-gate voltage limitation is eliminated while preserving the advantages of the circuit of FIG. 5. In this second embodiment of the transistor circuit according the invention, an active control for the gate-source voltage of the cascoded transistor connected to the high-voltage level node 3 is provided. That is, the first NMOS transistor, which in the circuit of FIG. 6 is referenced $T_b1$. Note that the transistor referenced $T_a1$ corresponds to transistor T1 of FIG. 5. Likewise, the NMOS transistors referenced $T_a4$ and $T_b4$ functionally correspond to the transistor T4 of FIG. 5.

In the embodiment of FIG. 6, a trigger circuit is formed by PMOS transistors T5 and T6. The sources of T5 and T6 connect to the gate of $T_b1$, the gate of T6 connects to the drain of T5 and form a biasing terminal 9. The gate of T5 connects to the drain of T6 and the source of $T_b1$, and the biasing terminal 9 connects to the gate of $T_a1$ and the biasing voltage source 7.

In operation, if $V_H$ at the high-voltage level node 3 is at a high level, the gate-source voltage of transistor $T_b1$ is small because transistor T6 is conductive, such that the source voltage of transistor $T_b1$ is more or less equal to $V_H - \Delta V$, wherein ΔV is the voltage drop across the diode-connected transistor $T_b4$, thereby avoiding hot channel electron injection and high oxide fields. If $V_H$ at the high-voltage level node 3 is at low level, the gate-source voltage of transistor $T_b1$ is at a high level, more or less equal to the voltage level of the biasing voltage source 7, because transistor T5 is in its conductive state.

Figure 7:
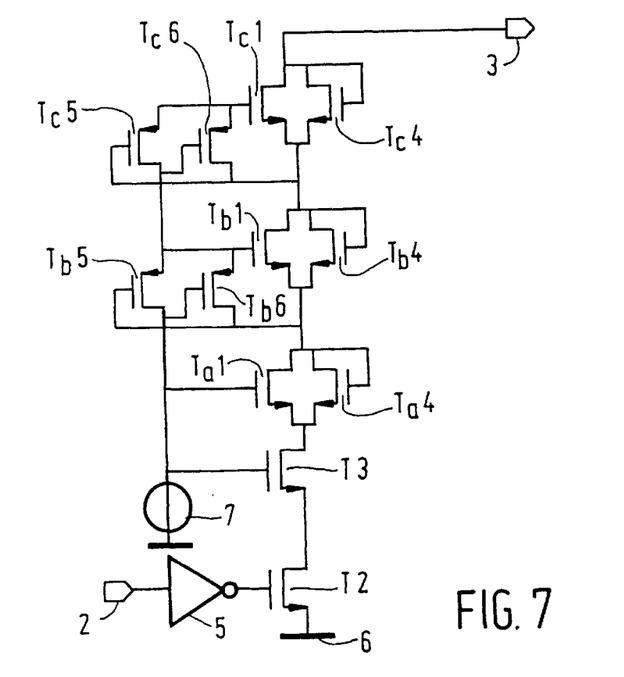
FIG. 7 shows a stacked high-voltage level tolerant transistor circuit based on the embodiment of FIG. 6.

Accordingly, with the active control trigger circuit provided by the transistors T5 and T6, hot channel electron injection is effectively reduced, without increasing the oxide electric field, which implies that this circuit can be easily stacked, as shown in the circuit diagram of FIG. 7.

In FIG. 7, a further cascoded transistor $T_c1$ and associated level shifter $T_c4$ and trigger circuit $T_c5$ and $T_c6$ are stacked, such that the gate of transistor $T_b1$ is connected to the drain of transistor $T_c6$ which comprises a biasing circuit.

Figure 8A:
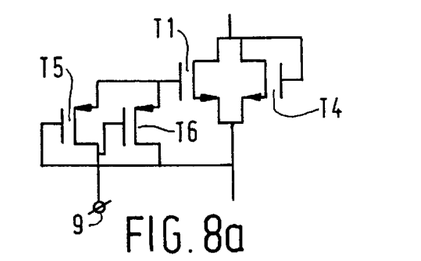
FIGS. 8a–d show alternative circuit diagrams of part of the high-voltage level tolerant transistor circuit of FIG. 6.
Figure 8B:
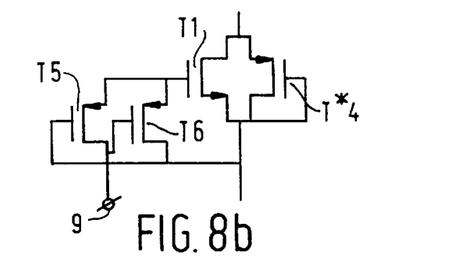
Figure 8C:
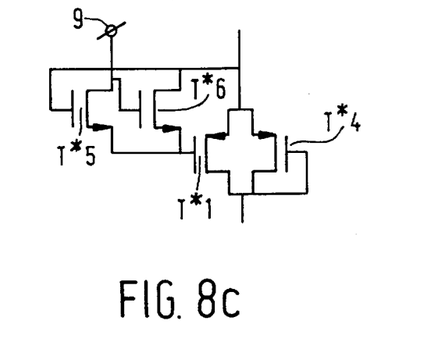
Figure 8D:
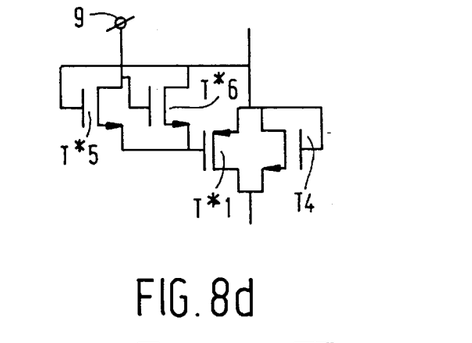

The cascoded NMOS transistor T1 and the biasing circuit comprising an NMOS transistor T4 and PMOS transistors T5 and T6 shown in FIG. 8 and discussed with reference to FIGS. 6 and 7 can, of course, also be realized with transistors of different conductivity type, as illustratively shown in FIGS. 8b, 8c and 8d. Like transistors of opposite conductivity type are indicated with the same reference numerals, however provided with an *. Terminal 9 indicates the biasing terminal of the respecting biasing circuits. For a person skilled in the art, the operation of the alternative embodiments will be clear from the previous description.

Figure 9:
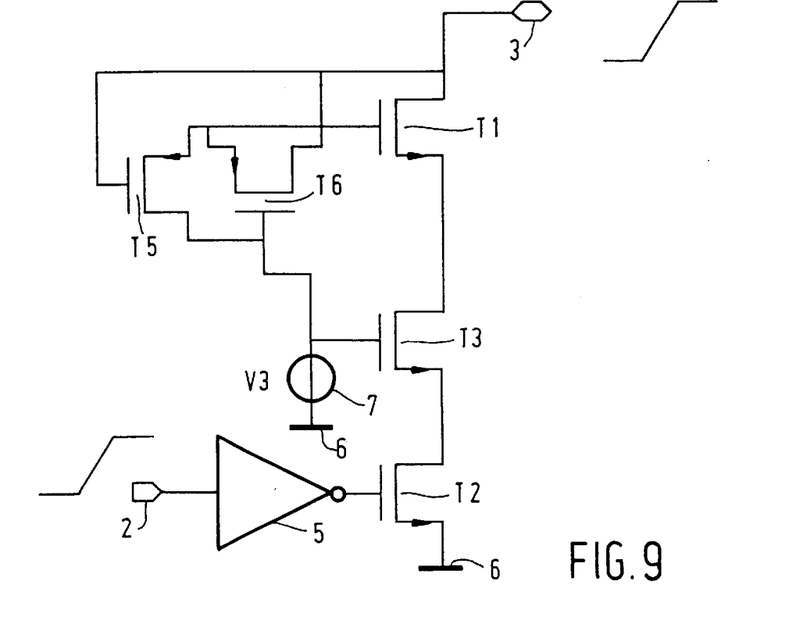
FIG. 9 shows a third embodiment of a high-voltage level tolerant transistor circuit in accordance with the present invention.

A third, preferred embodiment of the transistor circuit according to the invention is shown in FIG. 9. Contrary to the embodiment of FIG. 6, the drain of transistor T6 connects to the drain of transistor T1 and the gate of transistor T5. Further, the voltage level shifter is omitted.

In the transistor circuit of FIG. 9, the transistors T5 and T6 switch the gate voltage of transistor T1 between the voltage of the biasing voltage source 7 and the drain voltage of transistor T1, that is, with reference to (1) and FIG. 4:

$$V1 \approx \begin{cases} V_H & \text{if } V_H > V3 \\ V3 & \text{if } V_H < V3 \end{cases} \quad (5)$$

Figure 10:
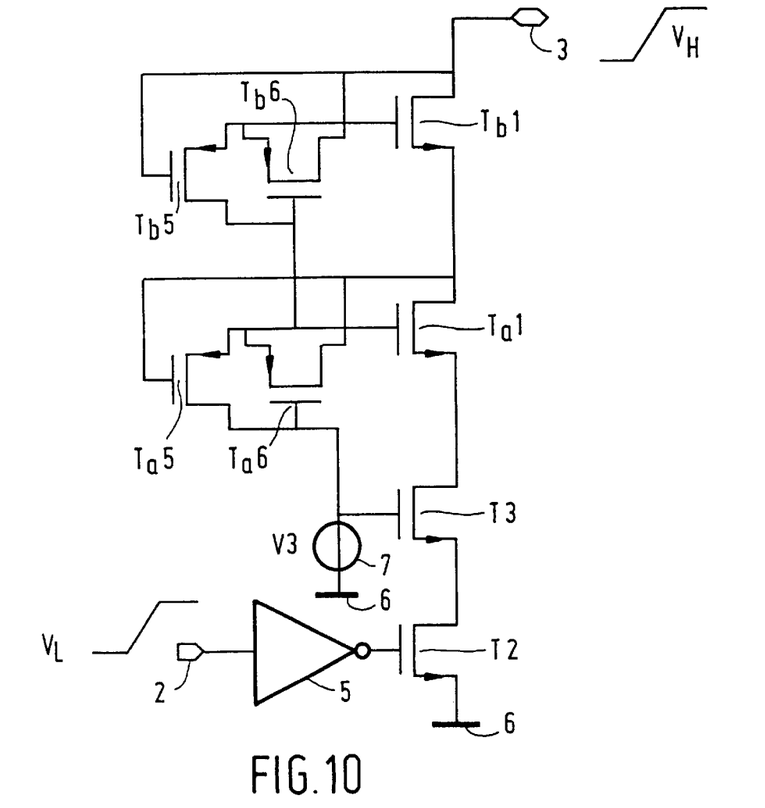
FIG. 10 shows a stacked embodiment of the high-voltage level tolerant transistor circuit based on the embodiment of FIG. 9.

The circuit of FIG. 9 provides less leakage current and is again stackable to obtain tolerance to higher voltages, such as shown in FIG. 10.

In FIG. 10, for the lower circuit, i.e. transistors $T_a1$, $T_a5$, $T_a6$ the biasing voltage of the cascoded transistor $T_a1$ follows from:

$$VI \approx \begin{cases} V_H - \Delta V & \text{if } V_H - \Delta V > V3 \\ V3 & \text{if } V_H - \Delta V < V3 \end{cases} \quad (6)$$

wherein ΔV=voltage drop across $T_b1$ in the "high" state of $V_H$. In practice, due to the presence of, for example, junction leakage and body-effect, the voltage drop ΔV is typically about 1 V.

Referring back to the circuit of FIG. 9, by increasing the voltage drop over, for example, the cascode transistor T1, the circuit as a whole can be made tolerant to higher voltages. Such higher voltage drop over the cascode may pose a problem for a circuit operating at very high speeds (for example I/O without slew-rate control) but may not provide a problem in slower circuits. Such a higher voltage drop can be achieved by adding a level shift circuit between the drain of transistor T1 and the drain of transistor T6, such as schematically shown in FIGS. 11 and 12.

Figure 11:
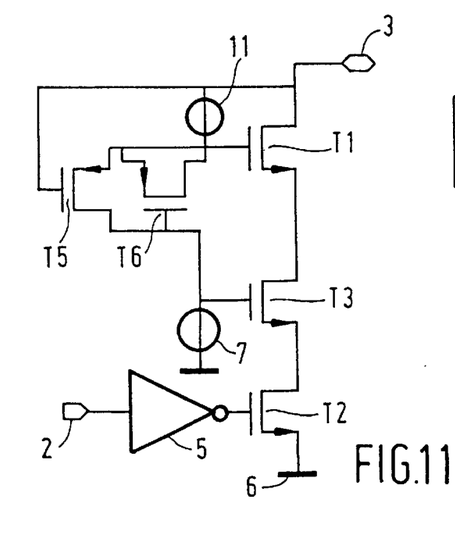
FIGS. 11 and 12 show first and second modifications, respectively, of the high-voltage level tolerant transistor circuit of FIG. 9.
Figure 12:
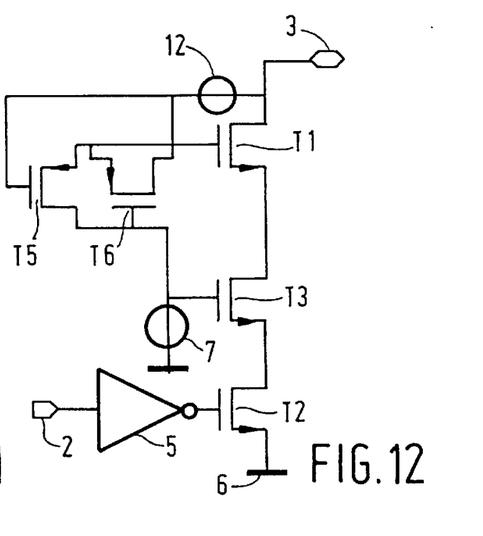

FIG. 11 shows an implementation using a ΔV voltage level shifter 11 series connected with the drain of transistor T6 and FIG. 12 shows an implementation using a ΔV voltage level shifter 12 series connected with the junction point of the gate of transistor T5 and the drain of transistor T6. An implementation of such a level shifter could be a (small) MOST-diode.

For applications in which the (otherwise) tolerable voltage is just too low, this solution may be very efficient: an extra cascode stage is not required at the expensive of the addition of a relatively small level shifter. Noting that the number of stacked transistors (hence the number of cascodes) is very important in the occupation of the total chip area (going from 3 to 4 stacked transistors with the same current drive, and for the same overall W/L of the stacked transistors, result in an increase of the power-transistors by effectively 16/9·2). The present solution to increase tolerable voltages is very chip area efficient.

For sufficient life-time of the transistor circuit, all the transistors of the circuit should have sufficient life-time. Under some conditions, the transistors T5 and T6 of the biasing trigger circuit suffer from a relatively high stress: the voltage drop between the drain of the first transistor T1 and the drain of transistor T5 may be quite large. This may cause both hot-carrier injection and high oxide stress for the transistors T5 and T6.

In order to solve this problem, cascoded biasing circuits may be used, such as shown in FIG. 10, or another level-shifter may be added to limit the voltages at the transistors T5 and T6. As will be appreciated, the latter solution is by far the most area efficient.

Figure 13:
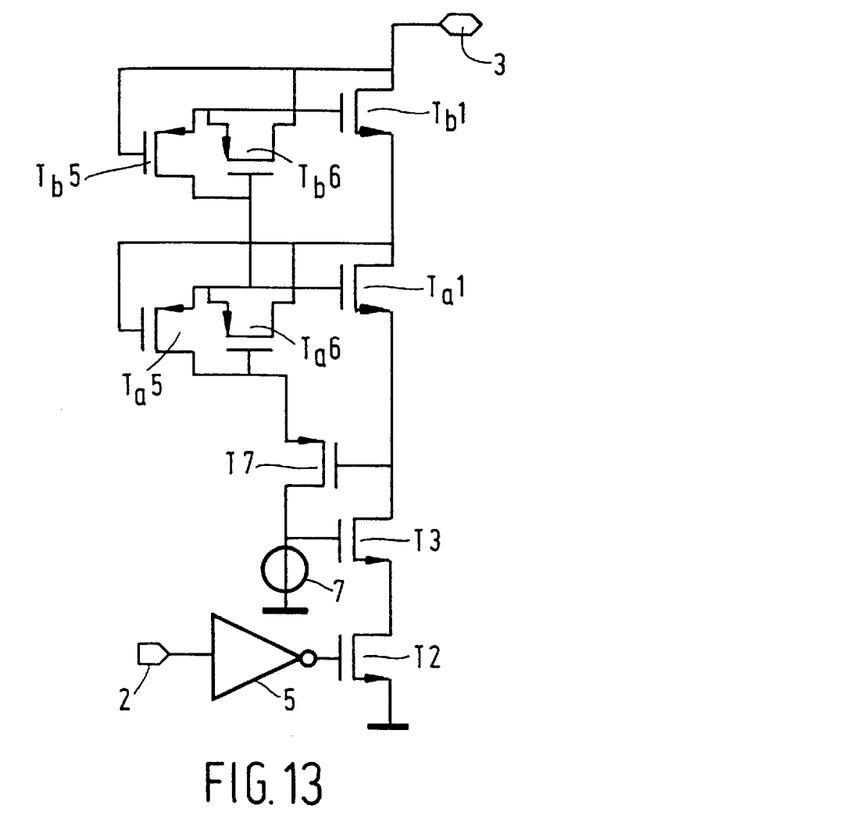
FIG. 13 shows a modification of the high-voltage level tolerant transistor circuit of FIG. 10.

An example of the addition of a still further voltage level shifter is shown in the circuit diagram of FIG. 13 comprising a PMOS transistor T7, the main channel of which is series connected with the biasing voltage source 7 and the gate connects to the drain of the cascode transistor T3.

Figure 14:
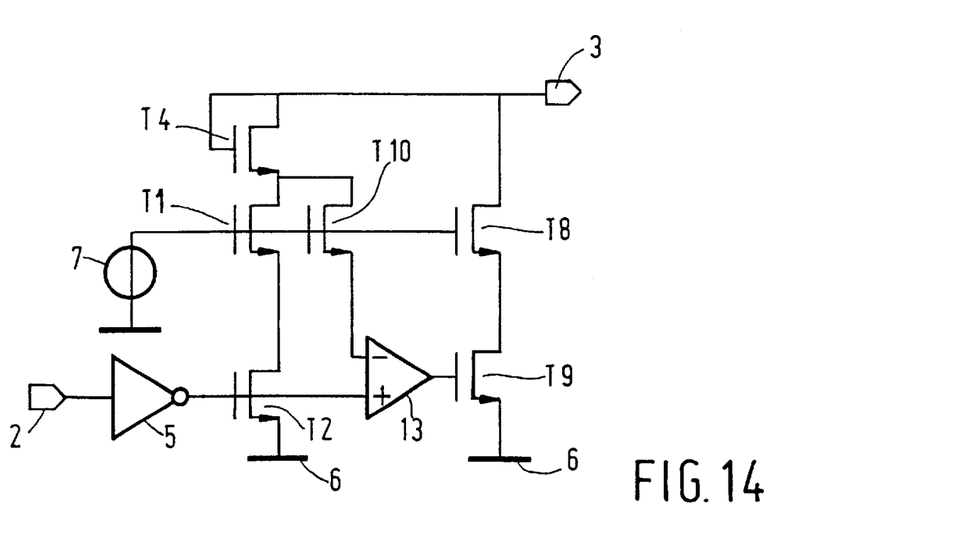
FIG. 14 is a circuit diagram of a fourth embodiment of the high-voltage level tolerant transistor circuit in accordance with the present invention.

Another, third embodiment of the transistor circuit according to the invention, is shown in the circuit diagram of FIG. 14.

The circuit comprises two cascoded stacks of NMOS transistors, that is a first stack comprised by the transistors T1, T2, T4 and a second stack comprised by the transistors T8 and T9. The diode-connected transistor T4 operates as a voltage level shifter for lowering the voltage of the biasing voltage source to a level equal to an inner supply voltage, such as Vdd. Further, the accuracy demands on the voltage level source 7 are reduced significantly. Each of the cascoded stacks operates in a specific region. In order to ensure life-time for the transistor T8, this cascoded stack is switched by transistor T10 and a differential circuit 13, having a non-inverting input (+) operatively connected to the low-voltage level node 2, via the inverter 5, and an inverting input (−) connected to the source of transistor T10. Note that the circuit 13 may be replaced by any other suitable device such as, but not limited to, a logic gate, an analog circuit, etc.

The cascoded transistor stage of the transistors T8 and T9 will become operative once the voltage at the high-voltage level node 3 is low, such to ensure life-time for this stack. Transistor T10 operates for sensing the voltage at the high-voltage level node 3.

As disclosed with reference to FIGS. 8a–d, the embodiments shown and discussed with reference to the FIGS. 9–14 may also be implemented with MOS transistors of different conductivity type, bipolar transistors etc.

Figure 15:
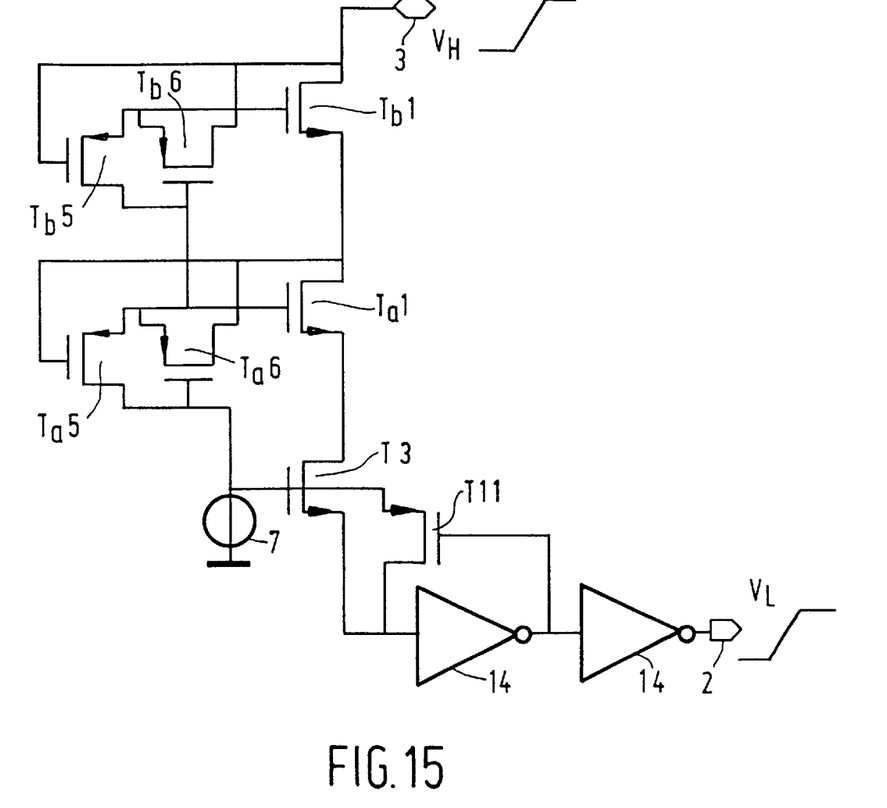
FIG. 15 is a circuit diagram of an embodiment of an I/O input cell based on the embodiment of FIG. 10.

Although in the above, the transistor circuit according to the invention has been illustrated in connection with an I/O-output cell, FIG. 15 shows a circuit diagram of a high-voltage tolerant I/O-input cell, implemented with the transistor circuit of FIG. 10.

In the circuit diagram shown, input circuits 14 are driven by a transistor T11, dependent on the voltage at the high-voltage level node 3. The high-voltage tolerant transistor circuit operates in the same manner as discussed above. Those skilled in the art will appreciate that, instead of the circuit of FIG. 10, the other high-voltage tolerant circuits according to the present invention can be used for driving the input circuits 14.

In the above, it is inherently assumed that the internal supply voltage Vdd is present at its nominal value at the time that the voltage at the high-voltage node gets high (e.g. 2*Vdd). However, if the I/O circuits operates in a multi-chip application, this condition may not always be satisfied. For example, in systems wherein chips communicate on a large bus, with power-down modes.

The high-voltage level node may be at 2*Vdd, while the internal supply voltage is down. Without precautions, this may lead to severe life-time problems of the transistor circuit. In order to solve this problem, a Cascode Voltage Generator (CVG) circuit 15 has been developed, generating a suitable biasing voltage for the cascode transistor circuit, even if the internal supply voltage is down, in order to ensure life-time.

Figure 16:
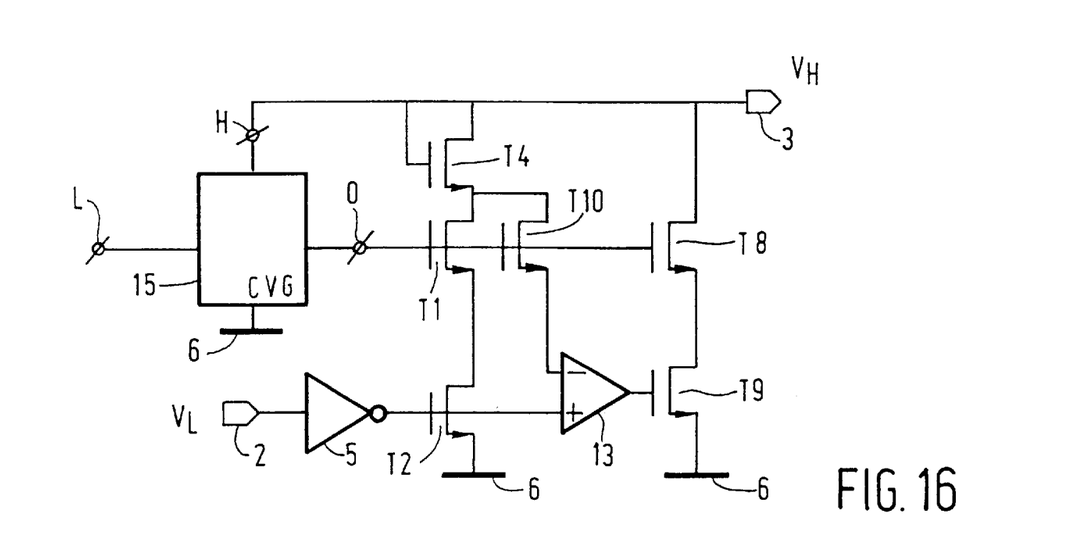
FIG. 16 is a circuit diagram of the high-voltage level tolerant transistor circuit of FIG. 14, having power-down start-up circuitry.

In the circuit diagram of FIG. 16, which is based on the embodiment of the transistor circuit according to the invention as disclosed above with reference to FIG. 14, the CVG circuit 15 generates a biasing voltage VO at its output terminal O required for safe power-down operation of the high-voltage tolerant transistor circuit according to the invention following $$VO \approx \begin{cases} V_H - V_{dd} & \text{if } Vi = \text{down} \\ Vi & \text{if } Vi = \text{up} \end{cases} \quad \text{or} \quad (7)$$

$$VO \approx \begin{cases} V_H - V_{dd} & \text{if } Vi < V_H - Vdd \\ Vi & \text{else} \end{cases} \quad (8)$$

wherein:

Vi=internal supply voltage at input terminal L of the CVG 15.

The above conditions (7) and (8) ensure that in (internal) power-down mode, no MOST degrades significantly; this condition must be satisfied for reasons of life-time.

In a practical embodiment, the CVG circuit 15 consists of two parts. A first part that takes care of generating a biasing voltage at the output terminal O of the CVG circuit, high enough to ensure life-time of all MOS transistors in the circuit. This part must be able to run in power-down mode and has to be fast in order to follow power-up transients at the high-voltage level node 3. In the present description, this part is denoted as Power-Down Start up (PDS) circuit. The CVG circuit 15 further comprises a second part that enables switching from the power-down-mode to the power-up-mode, if the internal voltage Vi is powered up. This circuit part is denoted as Power-Up Start up (PUS) circuit.

Figure 17:
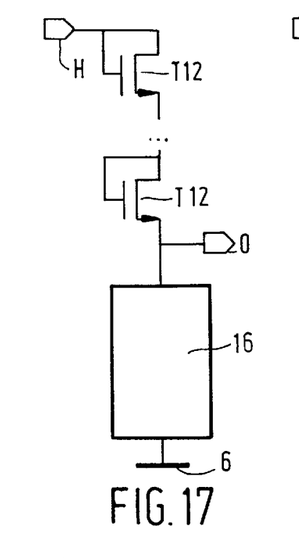
FIGS. 17, 18, 19 are circuit diagrams of power-down start-up circuits for use with the power-down start-up circuitry of FIG. 16.
Figure 18:
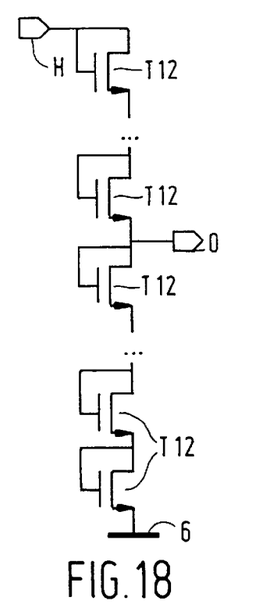
Figure 19:
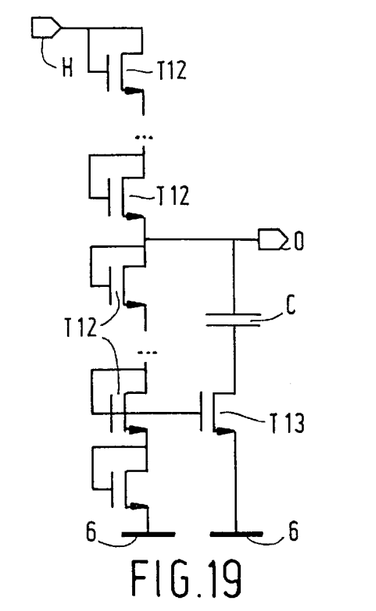

FIGS. 17, 18 and 19 show implementations of PDS circuits, comprising a plurality of diodes (NMOST diode-connected transistors), connected between the terminal H of the CVG circuit 15, for connection to the high-voltage level node 3, and system ground 6. In the circuit of FIG. 17, a voltage clamp 16 provides the requiring biasing voltage at the output terminal O. FIG. 18 shows an implementation of the voltage clamp using a simple diode-clamp. Because of the voltage drop across the diodes, this circuit can be configured to have about a Vdd voltage drop across the diodes if a high-voltage level of, for example, 2 Vdd is present at the high-voltage level node 3.

The voltage at the output terminal O may fluctuate significantly, which shortens life-time. A manner to minimize these fluctuations, while keeping fast power-down start up, is shown in FIG. 19. A ripple suppression capacitance C is switched via a series connected transistor T13, once the voltage at the terminal H is sufficiently high. Accordingly, the PDS-circuit provides a biasing voltage for the high-voltage level tolerant transistor circuits in power-down mode whenever necessary. In powered-up mode, it is however preferred to have the biasing voltage supplied by the internal supply voltage of the circuit, that is Vdd. To achieve this, the PDS has to be disabled and the internal supply voltage has to be gated to the output terminal O of the CVG circuit. The power-up switch PUS takes care of this.

Figure 20:
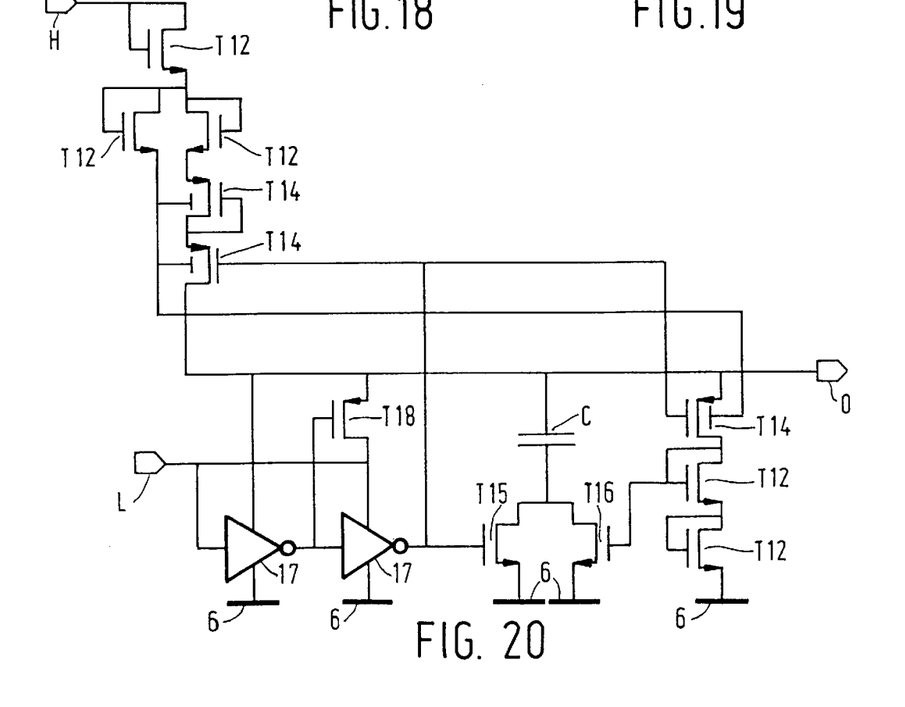
FIG. 20 shows a complete circuit diagram of the power-down start-up circuitry of FIG. 16.

In an embodiment, the PUS basically consists of an actively controlled transistor switch T18, as shown in FIG. 20.

The NMOS transistors T12 and PMOS T14 comprise the PDS circuit, with the ripple suppression capacitance C series connected with NMOS transistors T15 and T16. In the CVG circuit shown in FIG. 20, the PDS is automatically switched off if the internal supply voltage Vi at the input terminal L is "high" and simultaneously gates this internal supply voltage to the CVG output terminal O.

By replacing the inverter 17 by a NAND with EN input, the CVG circuit can be turned into a user configurable circuit. The N-well of the PMOSTs T14 have to be properly biased. Either by using the built-in source-well junction of PMOSTs or by bypassing this junction by an NMOS transistor connected as diode.

Based on the embodiment of the transistor circuit of the invention as shown and discussed with reference to FIG. 7, a 3*Vdd push-pull type high-voltage tolerant circuit can be formed from two 3*Vdd tolerant circuits, for example.

Figure 21:
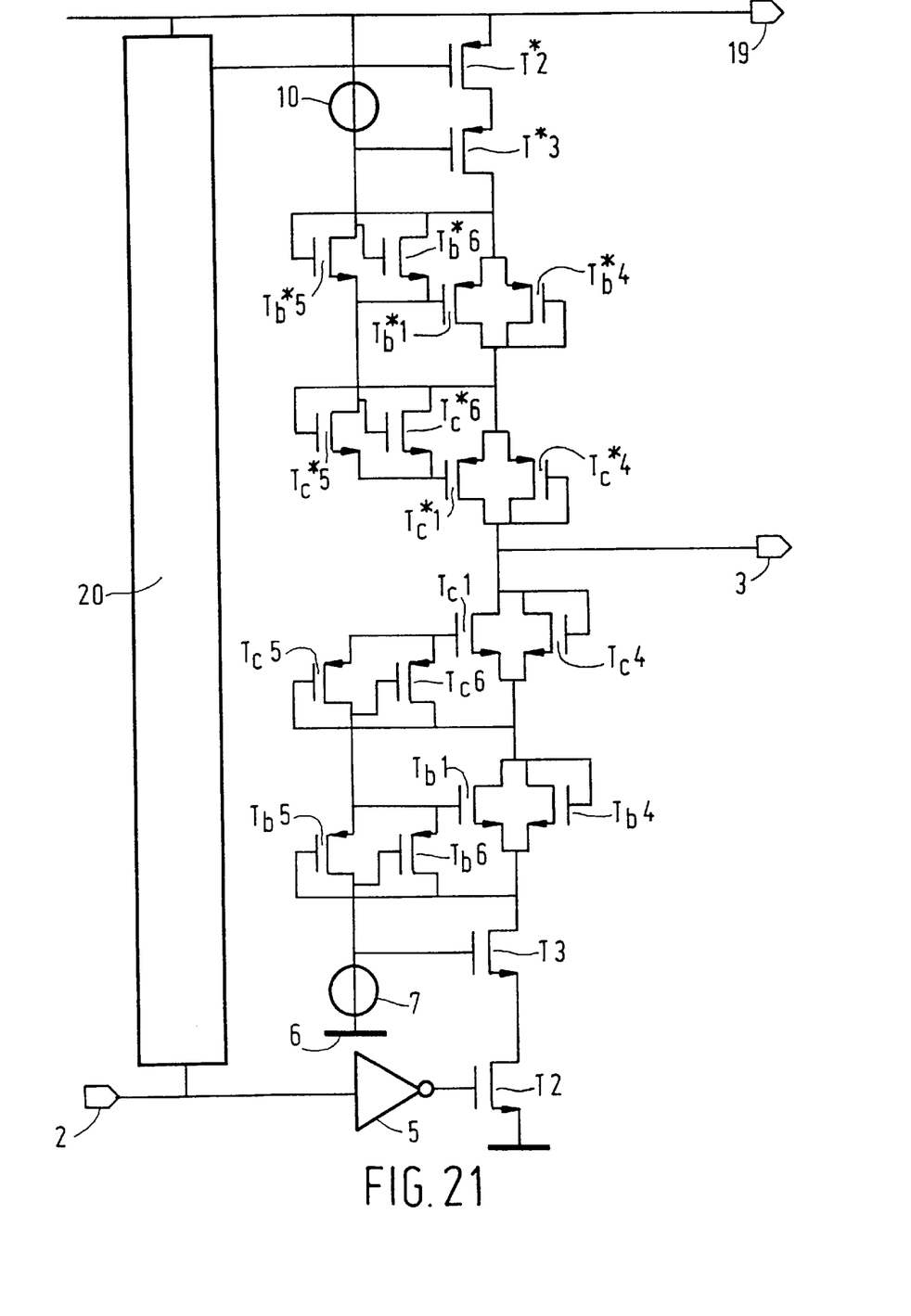
FIG. 21 is a circuit diagram of a high-voltage tolerant output circuit based on the embodiment of FIG. 7.

In the circuit diagram of FIG. 21, two 2*Vdd tolerant transistor circuits of opposite conductivity type are cascoded. The *–sign denotes transistors performing the same function, however of an opposite conductivity type. Voltage source 10 operates, in a like manner as voltage source 7, for biasing the cascode. Reference numeral 20 denotes a level shift and PMOST driver, which connects to the low-voltage level node 2 and a further high-voltage level node 19, which is 3*Vdd tolerant. At the high-voltage level node 3 voltages of 2*Vdd apply.

Those skilled in the art will appreciated that, in a transistor circuit according to the invention, at several positions level shifters may be introduced, in order to enhance its robustness, however without departing from the novel and inventive subject matter as defined in the appending claims.

What is claimed is:

1. A high-voltage level tolerant transistor circuit, comprising a plurality of cascoded transistors, including a first transistor operatively connecting to a high-voltage level node and a second transistor operatively connecting to a low-voltage level node, wherein said first transistor connects to a biasing circuit providing a variable biasing level, characterized in that said biasing circuit is arranged for providing a biasing level relative to a voltage level at said high-voltage level node, and wherein said biasing circuit comprises a voltage level shifter, said voltage level shifter being operative in response to said voltage level at said high-voltage level node.

2. Transistor circuit according to claim 1, comprising a first plurality of cascoded transistors and associated biasing circuits and a second plurality of cascoded transistors and associated biasing circuits, wherein said first plurality is arranged for connection thereof between said high-voltage level node and a first supply voltage node and said second plurality of cascoded transistors is arranged for connecting between said high-voltage level node and a second supply voltage level node in use having a voltage level in access of said voltage level at said high-voltage level node.

3. Transistor circuit according to claim 1, comprising a third transistor cascoded between said first and second transistor, wherein said first and third transistor having their control electrode connected for biasing by an internal supply voltage of said transistor circuit, and said level shifter comprises at least one fourth transistor operatively connected as a diode for bypassing said first transistor.

4. Transistor circuit according to claim 3, wherein said first, second and third transistors are of one conductivity type and said fourth transistor is of an opposite conductivity type.

5. Transistor circuit according to claim 3, wherein said biasing circuit comprises a bistable trigger circuit having a biasing terminal for applying a biasing voltage, said trigger circuit being arranged for providing a variable biasing level for biasing said first transistor in response to said voltage level at said high-voltage level node.

6. Transistor circuit according to claim 5, wherein said trigger circuit comprises a fifth and sixth transistor of opposite conductivity type compared to said first transistor, said fifth and sixth transistor having a first channel electrode operatively connected to a control electrode of said first transistor, said fifth transistor having a second channel electrode comprising said biasing terminal, said sixth transistor having a second channel electrode connected to a first channel electrode of said first transistor downstream of said high-voltage level node, and said fifth and sixth transistor having their control electrode operatively connected to said second channel electrode of said sixth and fifth transistor, respectively.

7. Transistor circuit according to claim 5, wherein said trigger circuit comprises a fifth and sixth transistor of opposite conductivity type compared to said first transistor, said fifth and sixth transistor having a first channel electrode operatively connected to a control electrode of said first transistor, said fifth transistor having a second channel electrode comprising said biasing terminal, said sixth transistor having a second channel electrode connected to a second channel electrode of said first transistor upstream towards said high-voltage level node, and said fifth and sixth transistor having their control electrode operatively connected to said second channel electrode of said sixth and fifth transistor, respectively.

8. Transistor circuit according to claim 7, comprising a further level shifter, operatively series connected with said second channel electrode of said sixth transistor.

9. Transistor circuit according to claim 6, comprising a plurality of cascoded first transistors and associated stacked biasing circuits, wherein said biasing terminal of a stack operatively connects to the control electrode of a first transistor of an adjacent stack downstream of said high-voltage level node.

10. Transistor circuit according to claim 6, comprising a still further voltage level shifter operatively series connected with said biasing supply voltage.

11. Transistor circuit according to claim 10, wherein said still further level shifter comprises a seventh transistor of opposite conductivity type compared to said third transistor, said seventh transistor comprising a control electrode operatively connected to a channel electrode of said third transistor upstream towards said high-voltage level node, a second level electrode operatively connected to a control electrode of said third transistor, and a first channel electrode operatively connected for biasing a biasing circuit upstream towards to said high-voltage level node.

12. Transistor circuit according to claim 1, wherein said level shifter comprising a fourth transistor operatively connected as a diode series connected between said high-voltage level node and said first transistor, further comprising a cascoded eight and ninth transistor, said eight transistor being operatively connected to said high-voltage level node, and a tenth transistor operatively series connected between said voltage level shifter and a first inverting input of a differential circuit, a second non-inverting input of which operatively connects to said low-voltage level node and an output of which connects to a control electrode of said ninth transistor, wherein said first, tenth and eight transistor having their control electrode connected for biasing by a supply voltage of said transistor circuit.

13. Transistor circuit according to claim 3, further comprising a cascode voltage generator circuit for applying a biasing voltage, said cascode voltage generator circuit comprising a first voltage level shifter operatively connected to said high-voltage level node for providing a biasing voltage and a power-up-switch circuit arranged for switching between said biasing voltage supplied by a power-down-start up circuit and an internal supply voltage of said transistor circuit.

14. Transistor circuit according to claim 13, wherein said power-down-start up circuit comprises a first and second series connected diode stack, and wherein said power-up-switch circuit comprises a first and second transistor switch series connected in between said diode stacks.

15. Transistor circuit according to claim 13, comprising first and second inverter circuits for driving said first and second transistor switches.

* * * * *